(12) United States Patent
Gani

(10) Patent No.: US 11,996,397 B2
(45) Date of Patent: May 28, 2024

(54) WAFER LEVEL PROXIMITY SENSOR

(71) Applicant: STMICROELECTRONICS PTE LTD, Singapore (SG)

(72) Inventor: David Gani, Choa Chu kang (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 155 days.

(21) Appl. No.: 17/360,925

(22) Filed: Jun. 28, 2021

(65) Prior Publication Data

US 2021/0327863 A1 Oct. 21, 2021

Related U.S. Application Data

(62) Division of application No. 15/087,959, filed on Mar. 31, 2016, now Pat. No. 11,069,667.

(51) Int. Cl.
| | | |
|---|---|---|
| *H01L 25/16* | (2023.01) | |
| *G01S 17/04* | (2020.01) | |
| *H01L 21/768* | (2006.01) | |
| *H01L 23/48* | (2006.01) | |
| *H01L 31/02* | (2006.01) | |
| *H01L 31/167* | (2006.01) | |

(Continued)

(52) U.S. Cl.
CPC ............ *H01L 25/167* (2013.01); *G01S 17/04* (2020.01); *H01L 21/76898* (2013.01); *H01L 23/481* (2013.01); *H01L 31/02005* (2013.01); *H01L 31/167* (2013.01); *H01L 31/1804* (2013.01); *H01L 31/186* (2013.01); *H01S 5/02325* (2021.01); *H04M 1/026* (2013.01); *G06F 2203/04105* (2013.01)

(58) Field of Classification Search
CPC . H01L 25/167; H01L 21/7698; H01L 23/481; H01L 31/02005; H01L 31/167; H01L 31/1804; H01L 31/186; H01L 21/50; H01S 5/02325; G01S 17/04; H04M 1/026; G06F 2203/04105
See application file for complete search history.

(56) References Cited

U.S. PATENT DOCUMENTS

| 4,001,859 A | 1/1977 | Miyoshi et al. |
| 5,291,038 A | 3/1994 | Hanamoto et al. |

(Continued)

FOREIGN PATENT DOCUMENTS

| CN | 104332524 | * | 2/2015 | ............ H01L 31/173 |
| CN | 105977249 | * | 9/2016 | ............. H01L 25/16 |

(Continued)

*Primary Examiner* — Mary A Wilczewski
(74) *Attorney, Agent, or Firm* — Seed IP Law Group LLP

(57) ABSTRACT

Wafer level proximity sensors are formed by processing a silicon substrate wafer and a silicon cap wafer separately, bonding the cap wafer to the substrate wafer, forming an interconnect structure of through-silicon vias within the substrate, and singulating the bonded wafers to yield individually packaged sensors. The wafer level proximity sensor is smaller than a conventional proximity sensor and can be manufactured using a shorter fabrication process at a lower cost. The proximity sensors are coupled to external components by a signal path that includes the through-silicon vias and a ball grid array formed on a lower surface of the silicon substrate. The design of the wafer level proximity sensor passes more light from the light emitter and more light to the light sensor.

22 Claims, 6 Drawing Sheets

(51) Int. Cl.
*H01L 31/18* (2006.01)
*H01S 5/02325* (2021.01)
*H04M 1/02* (2006.01)

(56) References Cited

U.S. PATENT DOCUMENTS

| | | | |
|---|---|---|---|
| 5,382,810 | A | 1/1995 | Isaksson |
| 6,486,467 | B1 | 11/2002 | Speckbacher et al. |
| 7,030,359 | B2 | 4/2006 | Romhild |
| 7,067,926 | B2 | 6/2006 | Yamazaki et al. |
| 7,078,671 | B1 | 7/2006 | Sherrer |
| 8,053,800 | B2 | 11/2011 | Horio |
| 8,324,602 | B2 | 12/2012 | Wiese et al. |
| 8,604,436 | B1 | 12/2013 | Patel et al. |
| 8,669,631 | B2 | 3/2014 | Koseki |
| 8,779,361 | B2 | 7/2014 | Costello et al. |
| 8,779,443 | B2 | 7/2014 | Wong et al. |
| 9,030,832 | B2 | 5/2015 | Kwong et al. |
| 9,136,292 | B2 | 9/2015 | Coffy et al. |
| 9,269,848 | B2 | 2/2016 | Lermer et al. |
| 9,281,301 | B2 | 3/2016 | Haslbeck et al. |
| 9,305,967 | B1 | 4/2016 | A Tharumalingam |
| 9,322,901 | B2 | 4/2016 | Kerness et al. |
| 9,606,231 | B2 | 3/2017 | Halbritter |
| 9,627,572 | B2 | 4/2017 | Okushiba |
| 9,705,025 | B2 | 7/2017 | Tu et al. |
| 9,842,946 | B2 | 12/2017 | Minixhofer et al. |
| 10,720,545 | B2 | 7/2020 | Utsumi |
| 11,069,667 | B2 * | 7/2021 | Gani ................. G01S 17/04 |
| 11,688,815 | B2 * | 6/2023 | Saxod ............ H01L 31/02327 |
| | | | 257/82 |
| 2004/0077121 | A1 | 4/2004 | Maeda et al. |
| 2009/0166785 | A1 | 7/2009 | Camacho et al. |
| 2010/0181578 | A1 * | 7/2010 | Li ..................... H01L 31/153 |
| | | | 257/E31.095 |
| 2010/0187557 | A1 | 7/2010 | Samoilov et al. |
| 2011/0057129 | A1 | 3/2011 | Yao et al. |
| 2011/0108714 | A1 * | 5/2011 | Yang ..................... H01L 31/12 |
| | | | 257/E33.076 |
| 2013/0001398 | A1 | 1/2013 | Wada et al. |
| 2013/0009173 | A1 * | 1/2013 | Vittu ..................... G01S 7/4813 |
| | | | 257/E33.056 |
| 2013/0037891 | A1 * | 2/2013 | Huang ............... B81C 1/00896 |
| | | | 257/415 |
| 2013/0119282 | A1 | 5/2013 | Jin et al. |
| 2013/0164867 | A1 | 6/2013 | Ramasamy et al. |
| 2013/0248887 | A1 | 9/2013 | Coffy et al. |
| 2013/0334445 | A1 | 12/2013 | Tharumalingam et al. |
| 2013/0341650 | A1 | 12/2013 | Peng |
| 2014/0084308 | A1 | 3/2014 | Wong et al. |
| 2014/0231635 | A1 | 8/2014 | Kerness et al. |
| 2015/0028359 | A1 * | 1/2015 | Tu ......................... H01L 33/54 |
| | | | 257/82 |
| 2015/0061102 | A1 | 3/2015 | Lin et al. |
| 2015/0207016 | A1 | 7/2015 | Tharumalingam et al. |
| 2016/0061653 | A1 | 3/2016 | Chang et al. |
| 2016/0126403 | A1 | 5/2016 | Tu et al. |
| 2016/0141440 | A1 | 5/2016 | Chun et al. |
| 2016/0146639 | A1 | 5/2016 | Chan |
| 2016/0187530 | A1 | 6/2016 | Ma et al. |
| 2016/0233260 | A1 | 8/2016 | Yiu et al. |
| 2016/0284900 | A1 | 9/2016 | Konig et al. |
| 2016/0284920 | A1 * | 9/2016 | Saugier ............... H01L 31/0203 |
| 2016/0306042 | A1 | 10/2016 | Schrank et al. |
| 2016/0307957 | A1 | 10/2016 | A Tharumalingam |
| 2017/0125613 | A1 | 5/2017 | Minixhofer et al. |
| 2017/0287886 | A1 * | 10/2017 | Gani ..................... H01L 23/481 |
| 2018/0292568 | A1 | 10/2018 | Chen |
| 2019/0288155 | A1 | 9/2019 | Renard et al. |
| 2021/0327863 | A1 * | 10/2021 | Gani ................... H01S 5/02325 |

FOREIGN PATENT DOCUMENTS

| | | | | |
|---|---|---|---|---|
| CN | 109585434 | * | 4/2019 | ............ H01L 25/16 |
| CN | 106601727 | * | 9/2020 | ............ H01L 25/16 |
| EP | 2 955 759 | A1 | 12/2015 | |

* cited by examiner

WAFER LEVEL PROXIMITY SENSOR

BACKGROUND

Technical Field

The present disclosure generally relates to sensor technology.

Description of the Related Art

Electronic sensor technology is currently being incorporated into many consumer products, including automobiles, appliances, and mobile devices such as smart phones. Electronic micro-sensor devices can be used to detect environmental conditions such as temperature, humidity, rainfall, sounds, and the like. Such devices can also be used to detect modes of operation of consumer appliances in which they are installed, such as the orientation of a smart phone, use of voice commands, ambient light, and the like. Micro-sensors offer many advantages due to their size, reliability, and low cost. As electronic micro-sensors become smaller and less expensive, they are in higher demand.

One example of an electronic micro-sensor is a proximity sensor that detects the presence of nearby objects without a need for physical contact. Some proximity sensors emit a light beam that is reflected from a target object. The reflected light beam is then captured by the proximity sensor and compared with the emitted beam or with an ambient light level to detect changes that can yield information about the target object.

BRIEF SUMMARY

A miniature proximity sensor suitable for use in smart phones is integrated into a silicon substrate at the wafer level. The wafer level proximity sensor can detect whether or not a smart phone user is holding the phone up to their ear. If so, the touch screen can be disabled until the phone is moved away from the user's head. Once the proximity sensor no longer senses the presence of the user's head next to the touch screen, the touch screen can be re-enabled. The miniature proximity sensor therefore permits the user to conduct a telephone call without inadvertently selecting other functions from the touch screen of the phone, which might otherwise interrupt the call.

The wafer level proximity sensor is smaller than a conventional proximity sensor, and it can be manufactured using a shorter fabrication process, and therefore also at a lower cost. An array of proximity sensors is formed by processing a silicon substrate and a silicon cap separately, gluing the cap to the substrate, and forming an interconnect structure of through-silicon vias within the substrate. A light sensor and a light emitter are formed on, or attached to, the substrate, and connected to external components by a signal path that includes the through-silicon vias and a ball grid array formed on a lower surface of the silicon substrate. The design of the wafer level proximity sensor may receive more light from the light emitter and may permits more light to reach the light sensor.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale.

DETAILED DESCRIPTION

Figure 1:
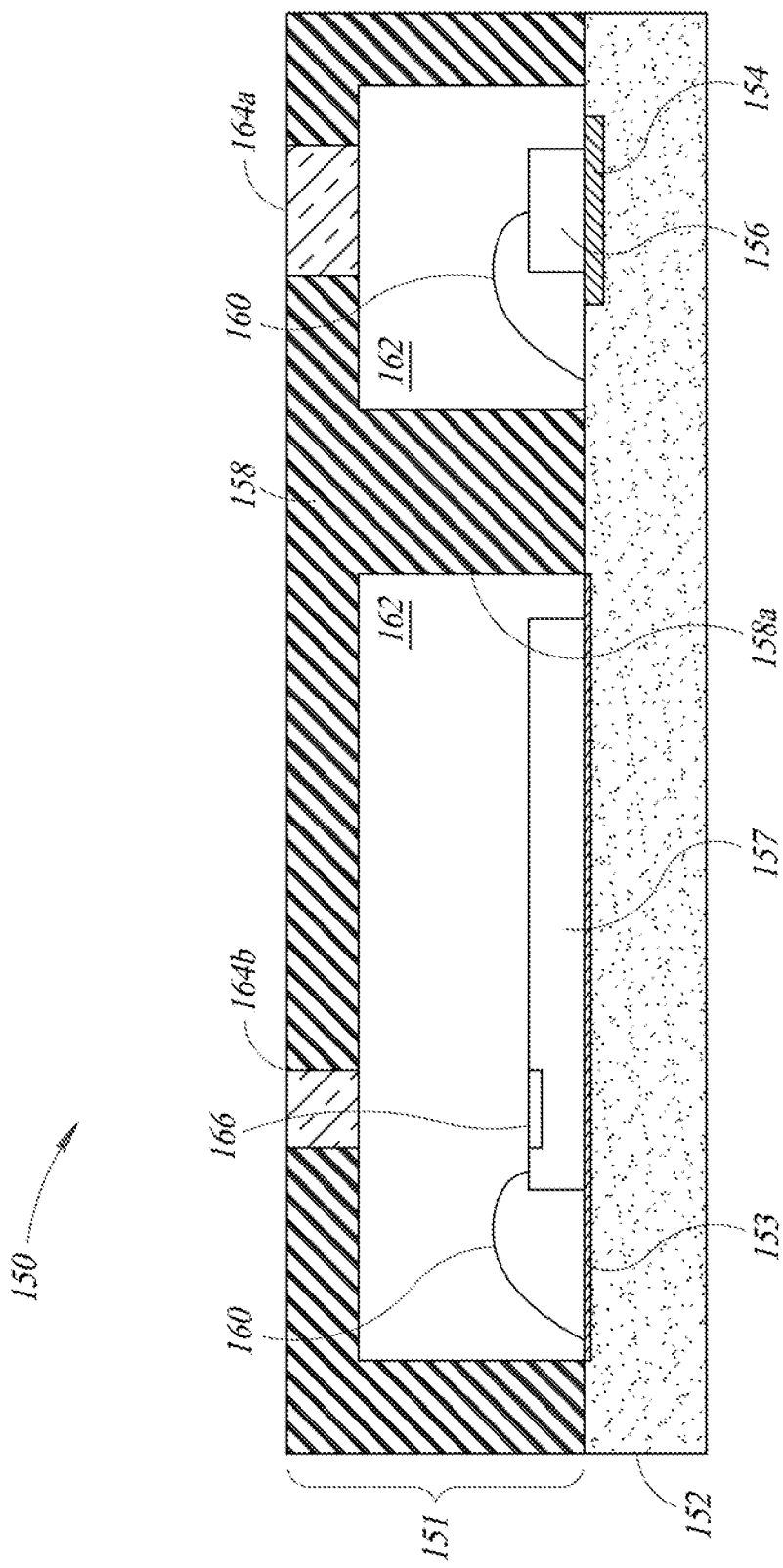
FIG. 1 is a cross-sectional view of a conventional proximity micro-sensor according to the prior art.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like and one layer may be composed of multiple sub-layers.

Reference throughout the specification to forming layers on a silicon substrate may entail the use of conventional thin film deposition techniques for depositing silicon nitride, silicon dioxide, metals, or similar materials, including such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, may include a spin-expose-develop process sequence typically followed by an etch process. Alternatively or additionally, photoresist can also be used to pattern a hard mask, e.g., a silicon nitride hard mask, which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to proximity sensors that have been produced; however, the present disclosure and the reference to certain materials, dimensions, and the details and ordering of processing steps are exemplary and should not be limited to those shown.

Turning now to the figures, FIG. 1 shows an example of a conventional proximity micro-sensor module 150. The conventional proximity micro-sensor module 150 is housed inside a chip package 151 that is mounted on a substrate 152, e.g., a printed circuit board. The substrate 152 can be made of a ceramic material, or an organic, carbon-based material, as is known in the art. A typical chip package 151 is in the range of 2.0-4.0 mm wide and about 0.7-1.0 mm tall.

The chip package 151 includes conductive traces 153, a metal pad 154, integrated circuit dies 156 and 157, and a cap 158. The conductive traces 153 carry electrical signals from the integrated circuit dies 156, 157 to connect with external devices via bond wires 160. The metal pad 154 is integrated with the substrate 152 to support the integrated circuit die 156. The cap 158 is spaced apart from the integrated circuit dies by a light transmitting region 162, about 0.5-0.9 mm high. The light transmitting region 162 may be filled with air, or it may be filled with a molded transparent layer that is made of silicon, or an epoxy-based transparent material, or the like. The cap 158 covers the integrated circuit dies 156, 157 to protect the dies from contamination. The cap 158 can be made of molded plastic or metal, for example, using an exposed die molding process, which is well known in the art. The process of exposed die molding may entail forming a two-layer cap that includes a transparent layer covered by an opaque layer.

In the conventional proximity micro-sensor module 150, the die 156 is a transmitter die and the die 157 is a sensor receiver die. The transmitter die 156 transmits a signal out from the conventional proximity micro-sensor module 150 through a first opening 164a in the cap 158. The transmitter die 156 includes a light source. The first opening 164a may be about 0.4-0.5 mm wide. The sensor receiver die 157 senses light that enters the chip package 151 through a second opening 164b in the cap 158. The second opening 164b may be about 0.2 mm wide. The first and second openings 164a, 164b can be glass windows or lenses. The transmitter die 156 is separated from the sensor receiver die 157 by a vertical member 158a of the cap 158. The vertical member 158a serves as a light barrier preventing light emitted from the transmitter die 156 from propagating directly to the sensor receiver die 157 along a horizontal path. The sensor receiver die 157 includes a light sensor 166. The light sensor 166 is mounted on a top surface of the sensor receiver die 157, underneath and aligned with the second opening 164b.

Figure 2:
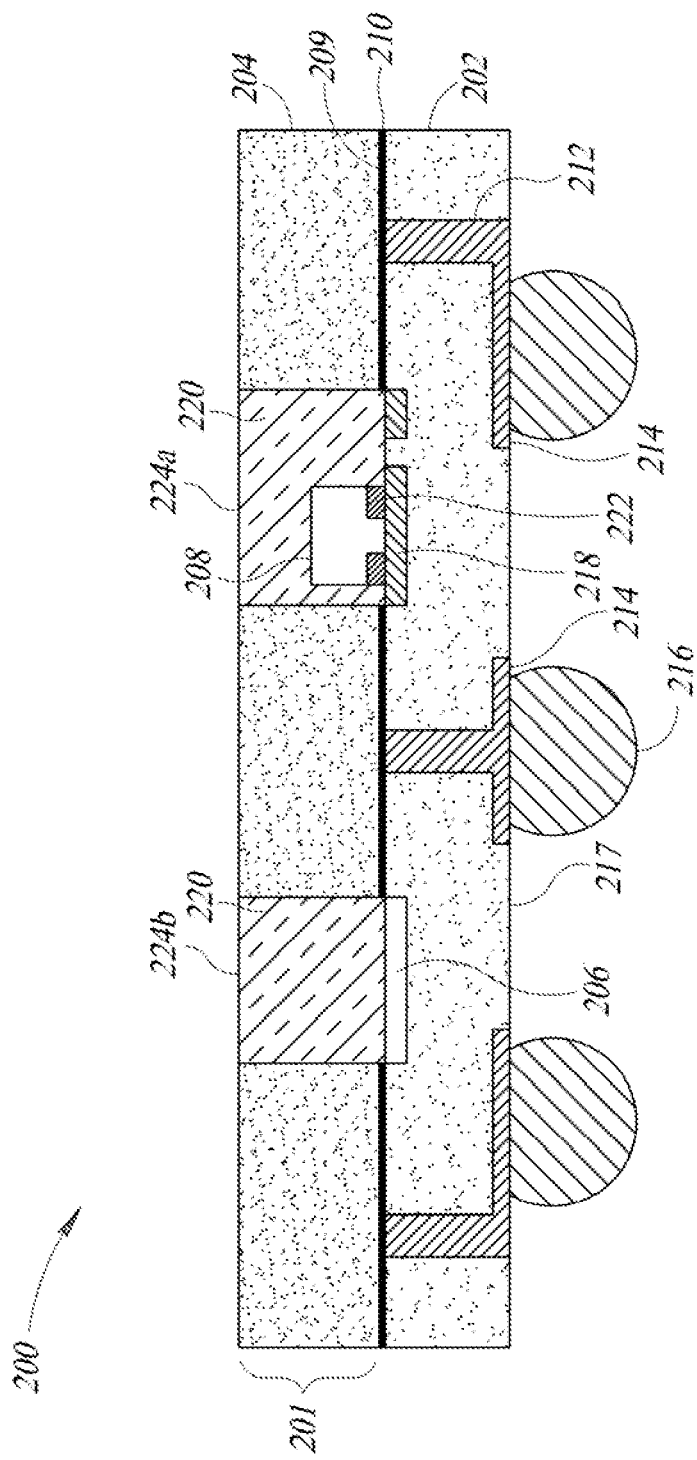
FIG. 2 is a cross-sectional view of a completed wafer level proximity sensor according to an embodiment as described herein.

FIG. 2 shows a wafer level proximity micro-sensor module 200, according to one embodiment. Wafer level proximity micro-sensor modules 200 are fabricated as integrated sensor packages. First, a silicon substrate wafer 202 and a silicon cap wafer 204 are processed separately. The separate wafers are then bonded to form a bonded wafer sandwich. Upper and lower surfaces of the bonded wafer sandwich are then processed further, and finally, the bonded wafer sandwich is singulated into the individual proximity micro-sensor modules 200.

The resulting wafer level proximity micro-sensor module 200 has many advantages over the conventional proximity micro-sensor module 150. For example, the wafer level proximity micro-sensor module 200 is smaller, less expensive to manufacture than the conventional proximity micro-sensor module 150.

With reference to FIG. 2, a singulated wafer level proximity micro-sensor module 200 is housed inside a miniature wafer level chip package 201 that is mounted on a silicon substrate 202. The wafer level chip package 201 includes a silicon cap 204 and integrated circuit dies 206 and 208. The silicon cap 204 has a lower surface 209. The miniature wafer level chip package 201 is attached to the silicon substrate 202 by a thin glue layer 210. The miniature wafer level chip package 201 is in the range of 1.4-1.6 mm wide and about 0.2-0.3 mm thick. The silicon substrate 202 is also about 0.2-0.3 mm thick, so that the total thickness of the wafer level proximity micro-sensor module 200, including the wafer level chip package 201 and the silicon substrate 202, is in the range of about 0.4-0.6 mm-about half as thick as the conventional proximity micro-sensor module 150. The reduced thickness makes the wafer level proximity micro-sensor module 200 particularly suitable for mobile devices such as smart phones that are desirably thin.

The silicon substrate 202 houses an interconnect structure of metal conduits in the form of a network of traces, through-silicon vias (TSVs) 212, and lower contact pads 214, as is known in the art. The TSVs extend all the way through the silicon substrate 202 from the top surface of the substrate 202 to the bottom surface of the substrate 202. Portions of the TSVs may be in abutting contact with one or more of the upper contact pads 218, the lower contact pads, 214, the solder balls 216, and the integrated circuit dies 206 and 208. Traces (not shown) that lie in a plane parallel to the cross-sectional plane of the drawings may connect the TSVs 212 to the integrated circuit dies 206 and 208 near the surface of the substrate 202. The through-silicon vias 212 and lower contact pads 214 carry electrical signals from the integrated circuit dies 206 and 208 to connect with external devices via solder balls 216. The solder balls 216 may be arranged in a ball grid array that is patterned on a lower surface 217 of the silicon substrate 202 as is known in the art. In one embodiment, the solder balls 216 have diameters of about 0.25 mm and are spaced apart such that the center-to-center pitch of adjacent solder balls 216 is in the range of about 0.35-0.40 mm. The total thickness of the wafer level proximity micro-sensor module 200 including the solder balls is therefore in the range of about 0.6-0.8 mm.

In the wafer level proximity micro-sensor module 200, the die 208 is a transmitter die and the die 206 is a light sensor array. The transmitter die 208 transmits light outward from the wafer level proximity micro-sensor module 200 through a first opening 224a in the cap 204. The transmitter die 208 includes a light source, e.g., a light-emitting diode or a laser diode. The transmitter die 208 is structurally and electrically coupled to the silicon substrate 202 by an upper contact pad 218 which is in turn coupled to a through-silicon via 212. A metallic layer 222 may couple the transmitter die 208 to the contact pad 218. The light sensor array 206 senses light that enters the wafer level chip package 201 through a second opening 224b in the cap 204. Signals received by the light sensor array 206 can be time-correlated with signals transmitted by the transmitter die 208 to distinguish relevant reflected light signals from non-relevant ambient light signals that come from external sources. Unlike the conventional proximity micro-sensor module 150, the silicon cap 204 does not cover any portion of the integrated circuit dies 206, 208.

The light sensor array 206 may sense light, for example, using a photodetector to count photons, e.g., a photodiode. If an object is present within about 20-30 cm of wafer level proximity micro-sensor module 200, the object will reflect some or all of the light so that the number of photons reaching the light sensor array 206 will increase. Alternatively, the light sensor array 206 may be a time-of-flight type sensor that senses a signal from the transmitter die 208 that is reflected from a target. The target location can be such that the total distance traveled by the emitted photons is up to 50 cm.

According to an embodiment, the silicon cap 204 can be patterned, using known lithography and etching techniques, prior to attaching the silicon cap 204 to the silicon substrate 202. Patterning the silicon cap 204 creates a light-transmitting region 220 around each of the integrated circuit dies 206, 208. In one embodiment, the light-transmitting region 220 may be filled with a transparent epoxy.

The transmitter die 208 is separated from the light sensor array 206 by a wall of the silicon cap 204 that is masked during the patterning process and therefore remains intact through the etching process that forms the first and second openings 224a, 224b. The silicon cap 204 between the first and second openings 224a, 224b serves as a light barrier preventing light emitted from the transmitter die 208 from propagating directly to the light sensor array 206 along a horizontal path. The first and second openings 224a, 224b may match, or extend beyond, the edges of the respective integrated circuit dies 206, 208. The first and second openings 224a, 224b can be patterned by optical lithography and etching, and then filled with the transparent epoxy such that light transmitted by the transmitter die 208 travels a distance of about 0.2 mm through the transparent epoxy before entering an ambient environment, e.g., air.

Figure 3:
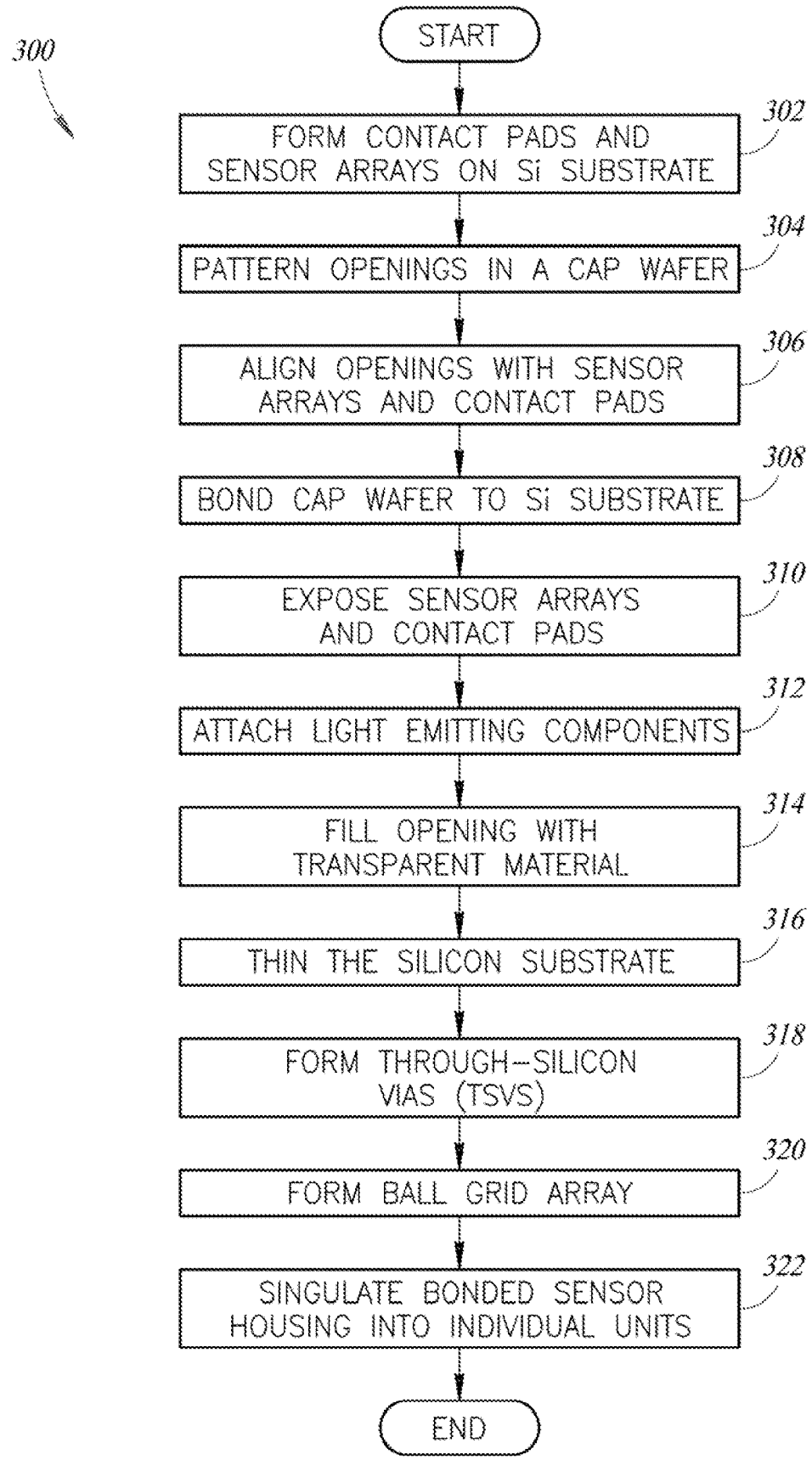
FIG. 3 is a process flow diagram showing steps in a method of fabricating an integrated circuit that includes the wafer level proximity sensor shown in FIG. 2, according to an embodiment as described herein.

FIG. 3 shows steps in a method 300 of fabricating wafer level proximity micro-sensor modules 200 according to one embodiment. Steps in the method 300 are further illustrated by the cross-sectional views shown in FIGS. 4-12, and described below.

Figure 4:
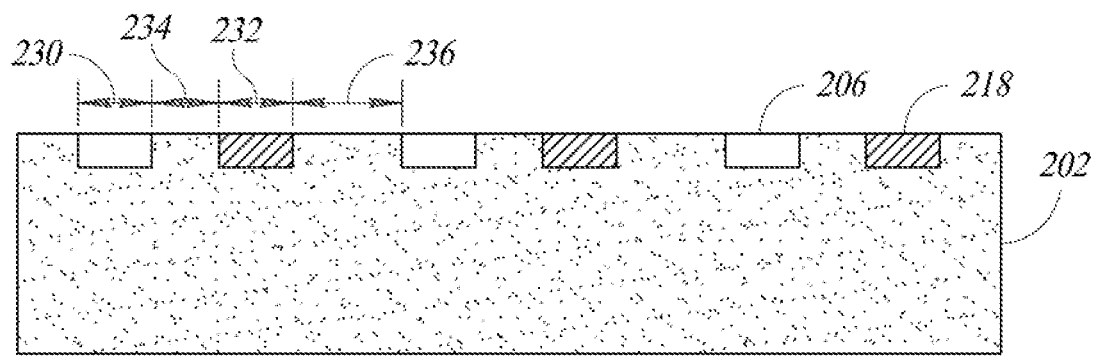
FIGS. 4-11 are cross-sectional views of the wafer level proximity sensor after various intermediate steps in the fabrication process shown in FIG. 3, according to an embodiment as described herein.

At 302, plurality of light sensor arrays 206 having widths 230 and an array of upper contact pads 218 having widths 232 are inlaid in the silicon substrate 202 in an alternating pattern, as shown in FIG. 4. Although the upper contact pads 218 are shown in the figures as extending to a same depth in the silicon substrate 202 as the light sensor arrays 206, the upper contact pads 218 may alternatively extend to a different depth than that of the sensor receiver dies, e.g., the upper contact pads 218 may be thinner than the light sensor arrays 206.

In one embodiment, a first array of trenches may be etched in the silicon substrate 202 to a first depth in a first etching step. The upper contact pads 218 may then be formed in the first array of trenches using a damascene plating process, as is known in the art. A second array of trenches may then be formed, in an alternating pattern with respect to the first array of trenches. Light sensor arrays 206 may be fabricated first, as integrated circuits in the silicon substrate 202, and then masked while the upper contact pads 218 are formed between each of the light sensor arrays 206. Alternatively, the light sensor arrays 206 may be placed in the second array of trenches.

A space 234 is formed between adjacent light sensor arrays 206 and the upper contact pads 218. A space 236 is formed between adjacent pairs of light sensor arrays 206 and the upper contact pads 218. The space 236 may be larger than the space 234, by design, to allow for singulation of the pairs of integrated circuit dies 206, 208.

Figure 5:
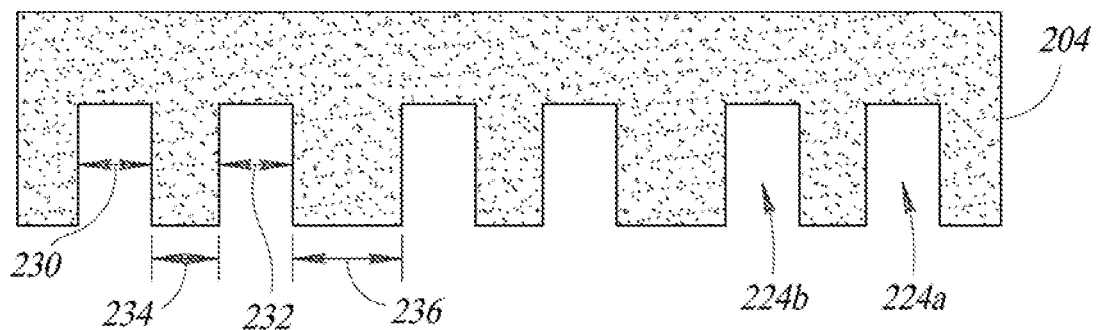

At 304, an array of openings 224a, 224b is formed in a silicon cap wafer, separate from the silicon substrate 202, to form silicon caps 204, as shown in FIG. 5. Widths 230, 232 of respective adjacent openings 224a, 224b are designed to match or exceed the widths of the upper contact pads 218 and the light sensor arrays 206, respectively. A space 234 between adjacent openings 224a, 224b is designed to match, or to be slightly smaller than, the space 234 between adjacent light sensor arrays 206 and the upper contact pads 218. A space 236 between pairs of the first and second openings 224a, 224b is designed to match, or to be slightly smaller than, the space 236 between pairs of the light sensor arrays 206 and the upper contact pads 218. The first and second openings 224a, 224b can be patterned using conventional optical lithography with photoresist masks, and silicon etching processes, for example. The first and second openings 224a, 224b generally have rectangular or square profiles. The first and second openings 224a, 224b may have profiles with rounded corners.

At 306, the first and second openings 224a, 224b are aligned with the lower contact pads 214 and the light sensor arrays 206, respectively.

Figure 6:
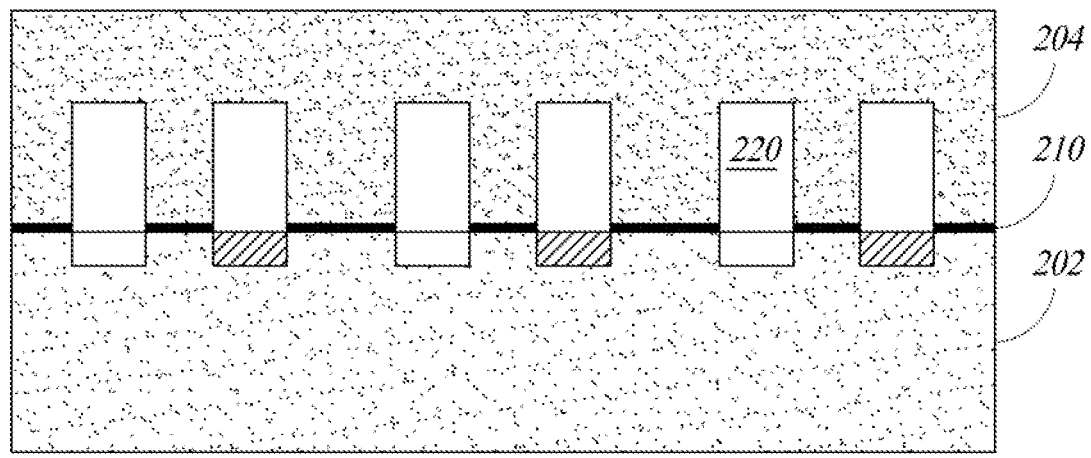

At 308, the silicon cap 204 is bonded to the silicon substrate 202 as shown in FIG. 6, using any available wafer-to-wafer bonding technology. The bonding process encloses the first and second openings 224a, 224b to form the light-transmitting regions 220. Bonding may entail application of the glue layer 210 to the lower surface 209 of the silicon cap 204, using a wafer-to-wafer bonding process that is well known in the art. The glue layer 210 can be made of, for example, a conventional epoxy bonding material. In one embodiment, the glue layer 210 is less than one micron thick.

Figure 7:
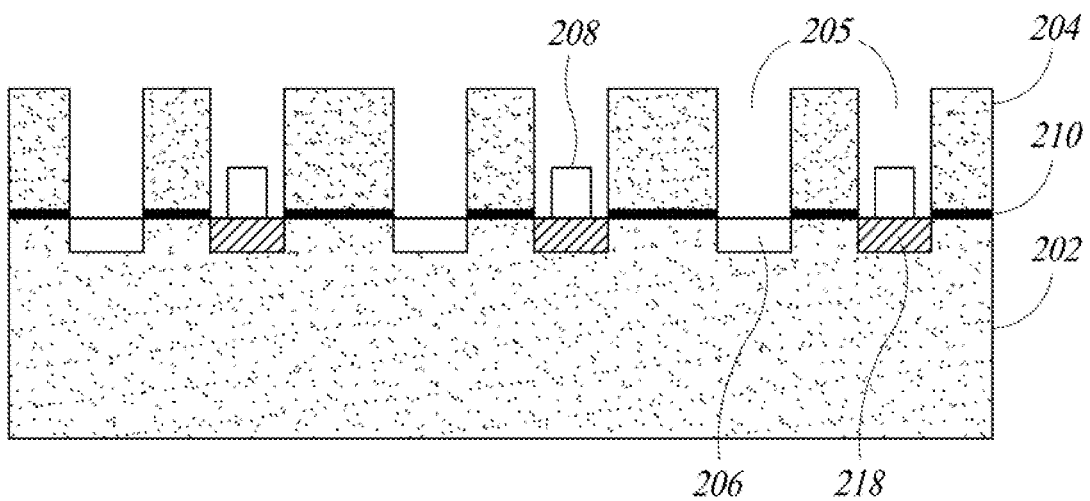

At 310, following wafer-to-wafer bonding, a back-grinding process is applied to the silicon cap 204 to expose the light-transmitting regions 220, as shown in FIG. 7. Such exposure will allow access to the upper contact pads 218, as well as permitting filling of the light-transmitting regions 220. The back-grinding process determines the amount of material that will separate the light source from air. Back-grinding of the silicon cap 204 can be done before or after bonding the silicon cap 204 to the silicon substrate 202.

At 312, the light-emitting transmitter dies 208 are lowered into the light-transmitting regions 220 for attachment to the upper contact pads 218, as shown in FIGS. 2 and 7. Examples of transmitter dies include a semiconductor-based vertical cavity surface-emitting laser (VCSEL) diode. The transmitter dies 208 have a thickness of about 0.12 mm.

Figure 8:
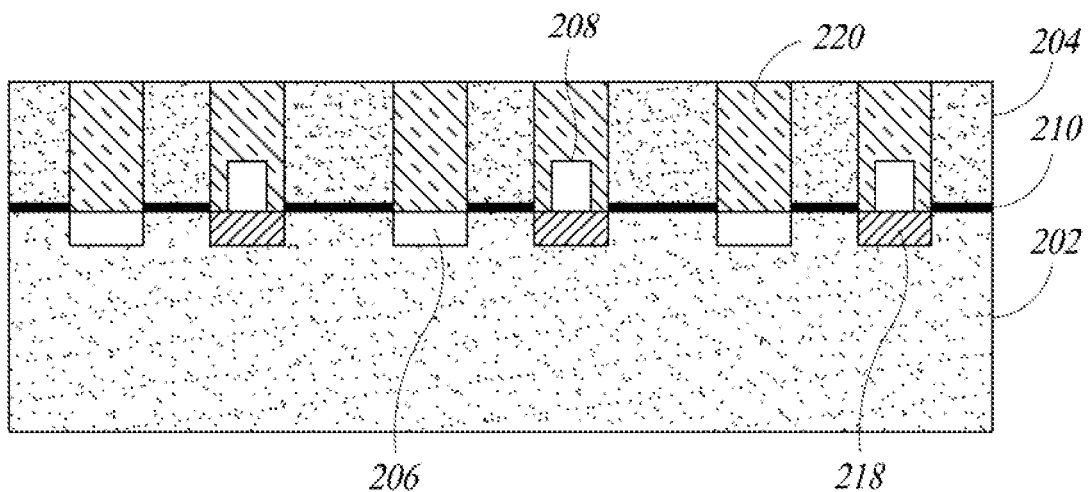

At 314, the light-transmitting regions 220 are filled with a transparent material, e.g., a transparent epoxy, as shown in FIG. 8.

Figure 9:
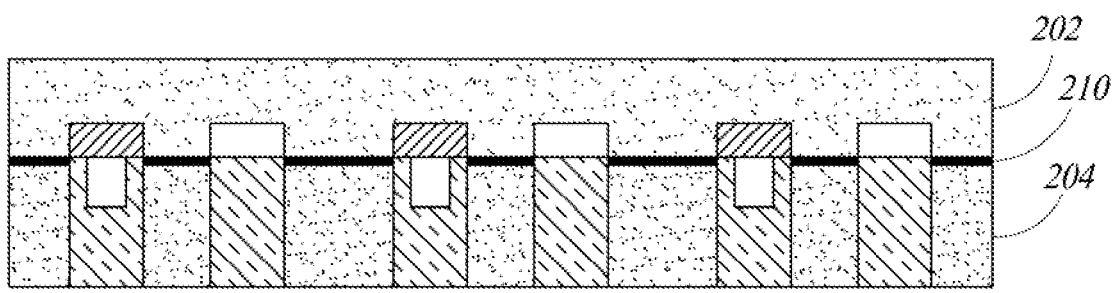

At 316, the silicon substrate 202 is thinned by a back-grinding process, as shown in FIG. 9.

Figure 10:
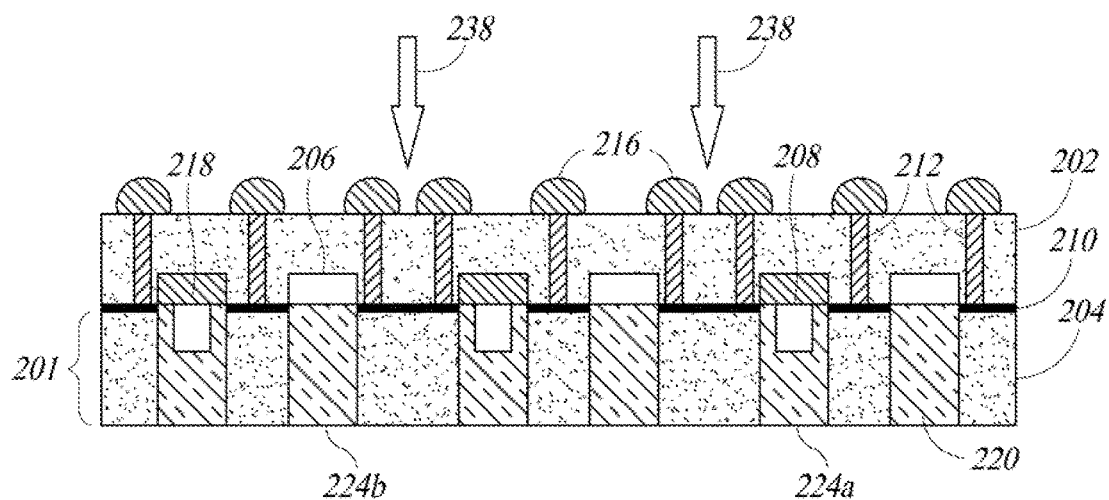

At 318, the through-silicon vias 212 and the lower contact pads 214 are formed in the silicon substrate 202, as shown in FIG. 10. The TSVs 212 extend all the way through the thickness of the silicon substrate 202 from the lower contact pads 214 to the glue layer 210. The through-silicon vias 212 may be formed using a through-silicon via process as is known in the art. The TSVs 212 have widths that are in the range of about 1.0-2.0 mm. The TSVs may connect directly to the transmitter dies 208 and light sensor arrays 206, or they may be coupled via traces in the silicon substrate 202 or traces on the transmitter dies 208 and light sensor arrays 206.

Figure 11:
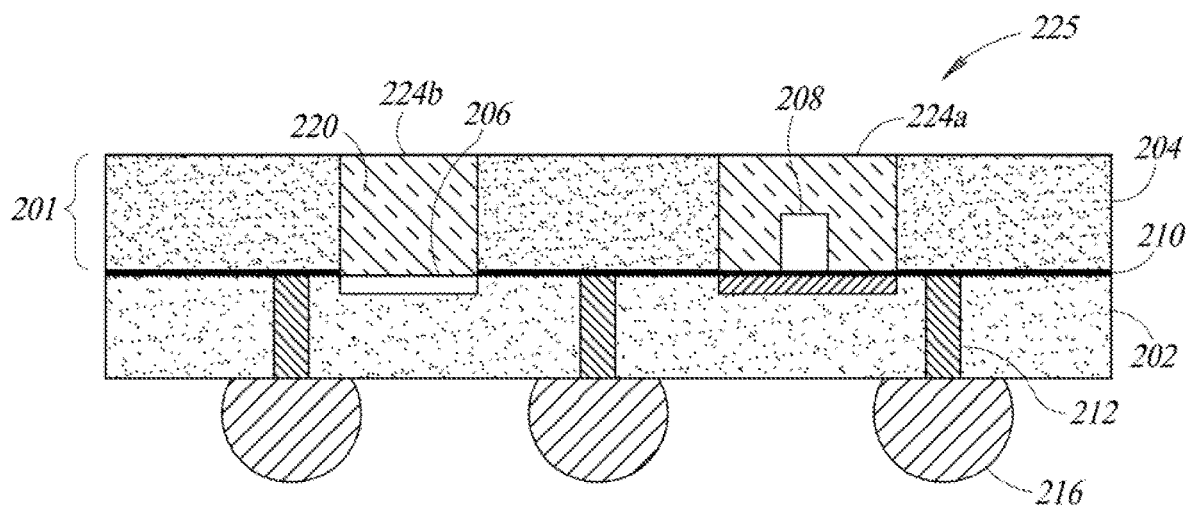

At 320, a ball grid array of solder balls 216 is formed on the lower surface 217 of the silicon substrate 202, as shown in FIG. 10. Each solder ball 216 may be coupled directly to a TSV 212 as shown in FIGS. 10-11. Alternatively, the solder ball 216 may be coupled to a TSV 212 by a lower contact pad 214 as shown in FIG. 2. A re-flow process may be applied to the solder balls 216 to provide a more robust connection to the lower contact pad 214.

At 322, the bonded wafers are singulated, or diced, to form individual wafer level proximity micro-sensor modules 200, as shown in FIGS. 10-11. FIG. 10 illustrates using a cutting tool 238 aligned with the spaces 236 to separate the wafer level proximity micro-sensor modules 200. The cutting tool 238 may be a saw, a laser beam, or any other tool suitable for wafer singulation. Each one of the singulated wafer level proximity micro-sensor modules 200 shown in FIG. 11 includes one transmitter die 208, one light sensor array 206, a plurality of TSVs, and a plurality of solder balls 216.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary, to employ concepts of the various patents, applications and publications to provide yet further embodiments.

The invention claimed is:

1. A method, comprising:
forming a plurality of light sensors on an upper surface of a silicon substrate;
forming a plurality of contact pads on the upper surface of the silicon substrate;
forming openings in a lower surface of a silicon cap wafer;
aligning the openings with the light sensors and the contact pads;
bonding the silicon cap wafer to the silicon substrate;
removing material from an upper surface of the silicon cap wafer to expose the light sensors and the contact pads;
attaching a plurality of light emitters to respective ones of the contact pads;
thinning the silicon substrate;
filling the openings with a transparent material;
forming through-silicon vias extending from the upper surface of the silicon substrate to a lower surface of the silicon substrate;
forming a ball grid array on the lower surface of the silicon substrate, the ball grid array including a plurality of solder balls electrically connected with respective ones of the through-silicon vias; and
singulating the bonded silicon wafers into individual sensor modules.

2. The method of claim 1, further comprising forming ball grid array contact pads on the lower surface of the silicon substrate, the ball grid array contact pads extending between the through-silicon vias and respective ones of the solder balls.

3. The method of claim 1 wherein bonding the silicon cap wafer to the silicon substrate further includes forming an epoxy layer between the silicon cap wafer and the silicon substrate.

4. The method of claim 1 wherein each sensor module includes one light emitter and one light sensor.

5. The method of claim 4 wherein attaching the light emitters includes attaching one or more of light emitting diodes (LEDs) and laser diodes.

6. The method of claim 1 wherein the light sensors and the contact pads are formed in a same layer of the silicon substrate.

7. The method of claim 1 wherein filling the openings with a transparent material includes filling the openings with a transparent epoxy.

8. A method, comprising:
coupling a cap to a first surface of a substrate including:
overlapping a contact pad at the first surface with a first recess extending into the cap; and
overlapping a light sensor at the first surface with a second recess extending into the cap;
exposing the first recess and the second recess from the cap by removing a portion of the cap extending across and overlapping the first recess and the second recess;
coupling a die to the contact pad in at least one of the following of the first recess and the second recess;
forming a transparent material in the first recess and the second recess;
after coupling the cap to the substrate, forming a first electrical via extending into the substrate at a second surface of the substrate opposite to the first surface, forming the first electrical via includes forming the first electrical via to be in electrical communication with the contact pad; and
after coupling the cap to the substrate, forming a second electrical via extending into the second surface the substrate, forming the second electrical via includes forming the second electrical via to be in electrical communication with the light sensor.

9. The method of claim 8, wherein coupling the die to the contact pad further includes positioning the die within the first recess.

10. The method of claim 8, wherein removing the portion of the cap exposing the first and second recesses from the cap occurs after the cap is coupled to the substrate.

11. The method of claim 8, wherein forming the transparent material further includes forming respective surfaces of the transparent material overlapping the first and second recesses substantially coplanar with a surface of the cap.

12. The method of claim 8, wherein forming the transparent material in the first recess and the second recess further includes:
covering the die and the contact pad with the transparent material; and
covering the light sensor with the transparent material.

13. The method of claim 8, wherein forming the transparent material in the first recess and the second recess further includes:
forming the transparent material directly on and physically coupled to the die and the contact pad; and
forming the transparent material directly on and physically coupled to the light sensor.

14. The method of claim 8, further comprising:
coupling a first solder ball to the first electrical via by forming the first solder ball on the second surface of the substrate; and
coupling a second solder ball to the second electrical contact by forming the second solder ball on the second surface of the substrate.

15. The method of claim 8, wherein the first and second electrical vias are through-silicon vias.

16. The method of claim 8, wherein exposing the first recess and the second recess from the cap by removing the portion of the cap extending across and overlapping the first recess and the second recess occurs after the cap has been coupled to the first surface of the substrate.

17. The method of claim 8, wherein exposing the first recess and the second recess from the cap by removing the portion of the cap extending across and overlapping the first recess and the second recess occurs before the cap has been coupled to the first surface of the substrate.

18. A method, comprising:
coupling a cap to a first surface of a substrate including:
overlapping a first recess in the cap with a contact pad at the first surface of the substrate; and
overlapping a second recess in the cap with a light sensor at the first surface of the substrate;
after coupling the cap to the first surface of the substrate, exposing the first recess and the second recess from the cap by removing a portion of the cap exposing the first recess and the second recess from the cap; and
after coupling the cap to the first surface of the substrate, forming one or more electrical vias extending into a second surface of the substrate opposite to the first surface of the substrate, forming the one or more electrical vias includes forming the one or more electrical vias to be in electrical communication with the contact pad and the light sensor.

19. The method of claim 18, wherein removing the portion of the cap further includes grinding the cap exposing the first recess and the second recess from the cap.

20. The method of claim 18, further comprising:
coupling a die to the contact pad overlapped by the first recess by positioning the die within the first recess.

21. The method of claim 20, further comprising:
forming a transparent material in the first recess and the second recess, forming the transparent material includes:
filling the first recess with the transparent material covering the contact pad and the die with the transparent material; and
filling the second recess with the transparent material covering the light sensor with the transparent material.

22. The method of claim 21, wherein:
filling the first recess with the transparent material further includes forming a first surface of the transparent material substantially coplanar with a respective surface of the cap; and
filling the second recess with the transparent material further includes forming a second surface of the transparent material substantially coplanar with the respective surface of the cap.

* * * * *